United States Patent [19]
Hilton

[11] Patent Number: 5,410,668
[45] Date of Patent: Apr. 25, 1995

[54] RECONFIGURABLE CACHE MEMORY WHICH CAN SELECTIVELY INHIBIT ACCESS TO DAMAGED SEGMENTS IN THE CACHE MEMORY

[75] Inventor: Ronald N. Hilton, Cupertino, Calif.

[73] Assignee: Amdahl Corporation, Sunnyvale, Calif.

[21] Appl. No.: 949,583

[22] Filed: Sep. 23, 1992

[51] Int. Cl.⁶ .............................................. G06F 13/14
[52] U.S. Cl. ..................................... 395/425; 395/400
[58] Field of Search ................................ 395/400, 425

[56] References Cited
U.S. PATENT DOCUMENTS 4,912,632  3/1990  Gach et al. ........................... 395/425
5,161,162  11/1992  Watkins ................................ 371/29.5

Primary Examiner—David L. Robertson
Attorney, Agent, or Firm—Fliesler, Dubb, Meyer & Lovejoy

[57] ABSTRACT

A cache memory system includes a buffer having a plurality of segments storing lines of data in addressable storage locations. A first access path is used for accessing the plurality of segments in parallel for access by the CPU, and a second access path is provided for access to the plurality of segments in the buffer in parallel for cache consistency access. Access to damaged segments is selectively disabled by inhibiting tag match and line replacement through the first access path without affecting the second access path. Thus, by disabling the first access path to selected segments, a damaged segment is reconfigured offline without a quiescent state or an extended clocks off period affecting CPU performance.

15 Claims, 6 Drawing Sheets

RECONFIGURABLE CACHE MEMORY WHICH CAN SELECTIVELY INHIBIT ACCESS TO DAMAGED SEGMENTS IN THE CACHE MEMORY

BACKGROUND OF THE INVENTION

1. Field of the Invention

The present invention relates to the memory reconfiguration in data processing systems; and more particularly to reconfiguration of cache memory to take failing segments of the cache offline in response to the detection of hard errors in the failing segment.

2. Description of Related Art

In order to achieve high availability in data processing systems, it is desirable to be able to reconfigure failing parts of the system out of operation, and thereby continue to function in a slightly degraded mode until repairs can be accomplished. The intrinsically higher failure rate of RAMs makes this especially desirable for cache memory systems of a CPU in a large scale data processing system, such as those operating in accordance with the IBM ESA/390 architecture.

When a failing portion of a cache memory is to be reconfigured offline, it is necessary to recover the remaining good data and validate the damaged data. In the prior art, this has been accomplished in several ways. One method is to release the entire contents of the cache via whatever means is provided in the machine for this purpose. For example, in the Amdahl 580, the service processor was able to send a bus message which caused the cache control hardware to perform this function with clocks on but with the system in a quiescent state. Another similar method to accomplish the same result, but with clocks off, is to scan out the contents of the cache, search throughout the system for any other data in transit, emulate the hardware's error correction process for any damaged data, and then scan the data back into appropriate locations in main store.

It is desirable to accomplish reconfiguration of cache memory in a data processing system without suffering a quiescent state or an extended clocks off period, such as imposed by prior art reconfiguration techniques.

SUMMARY OF THE INVENTION

The present invention overcomes some of the difficulties of the prior art by taking the failing portion of the memory offline for the purposes of accesses by the CPU and for replacement with new data, but leaving it online for the purpose of cache consistency operations. Thus, when any of the data in an offline portion of memory is requested by one of the processors in the system, the cache consistency hardware can gain access to move it out of the offline portion of the damaged cache and route it to the requesting processor through normal means. Over time, the reconfigured area of the damaged cache will be emptied of its data through the normal operation of the system, without any need for a quiescent state or an extended clocks off period.

Accordingly, the present invention can be characterized as a cache memory system which includes a buffer having a plurality of segments storing lines of data in addressable storage locations. A first access path is used for accessing the plurality of segments in parallel for access by the CPU, and a second access path is provided for access to the plurality of segments in the buffer in parallel for cache consistency processes. Means is provided for selectively disabling access to segments in the buffer memory through the first access path, without affecting the second access path. Thus, by disabling the first access path to selected segments, the selected segments are reconfigured offline without a quiescent state or an extended clocks off period affecting CPU performance.

According to one aspect, the cache includes a tag memory having a plurality of segments corresponding to the segments in the buffer memory which store tags identifying lines of data in the buffer memory. Tag match logic is coupled to the first access path for matching tags in the tag memory with requests for lines of data proceeding through the first access path. The tag match logic is used for disabling the first access path for selected segments by selectively inhibiting the tag match logic for individual segments.

For a computer system which includes one or more processors sharing access to a main storage system and a system controller controlling the shared access, and including a service processor coupled to the plurality processors, the present invention provides a cache memory system for a local processor in the plurality of processors which can be reconfigured in the manner described above. Thus, according to this aspect, the cache memory includes a buffer having a plurality of segments or associativities storing lines of data. The first access path having an interface to the local processor is used for access to the plurality of associativities in parallel, including associativity match logic for enabling access to the requested associativity by the local processor. Logic is included which is coupled to the first access path and has an interface to the service processor which selectively disables access to the associativities in the buffer memory through the first access path in response to commands from the service processor.

A second access path has an interface to the system controller and is used for access to the associativities of the buffer by the system controller for cache consistency operations and the like. The second access path also includes associativity selection logic for enabling access to an associativity requested by the system controller.

In order to take a segment or associativity of the buffer offline, the service processor issues commands for inhibiting tag match and for inhibiting cache line replacement to the associativity suffering the error. Thus, the invention can be further characterized as including a tag memory and storing tags identifying lines of data in the buffer memory, and tag match logic, coupled to the first access path and the tag memory, for matching tags for lines of data in the plurality of associativities with requests for the line of data in the first access path. Access to a selected associativity through the first access path can be inhibited by inhibiting the tag match logic corresponding to the selected associativity.

A selected associativity can thus be taken offline by inhibiting the tag match logic coupled to the given associativity. In one aspect of the invention, a plurality of operating state latches is provided which selectively inhibit tag match logic for each of the associativities. The service processor is coupled to the operating state latches, and issues a command to set the latches in order to reconfigure the cache.

In another aspect, replacement of lines of data in the cache in an associativity which has been detected as containing a hard error must be inhibited as well. Thus, the cache replacement logic which is used for selecting a line of data for replacement when a new line of data must be moved into the cache, is controlled by commands from the service processor to prevent replacement of lines of data in the bad segment of the cache. This technique may also be accomplished using operating state latches coupled with the line replacement logic.

Error detection logic is also provided on both access paths. Thus, operations by the system controller which result in selecting data in a bad segment of the cache detect any errors in the accessed line with appropriate error checking and correcting logic.

Data in the associativity which has been configured offline in this manner is eventually released to the system through normal data integrity activity. Thus, when a CPU desires access to the data in the offline segment of the cache, the CPU will detect a line miss, and request the line from the system controller. The system controller will request the data integrity move out of the line of data if it is held in a private manner by an offline cache segment. If the error is correctable, then corrected data can be supplied to the requesting CPU. If the error is uncorrectable, then appropriate machine checks or other operations can be carried out.

Other aspects and advantages of the present invention can be seen upon review of the figures, the detailed description, and the claims which follow.

DESCRIPTION OF THE PREFERRED EMBODIMENTS

Figure 1:
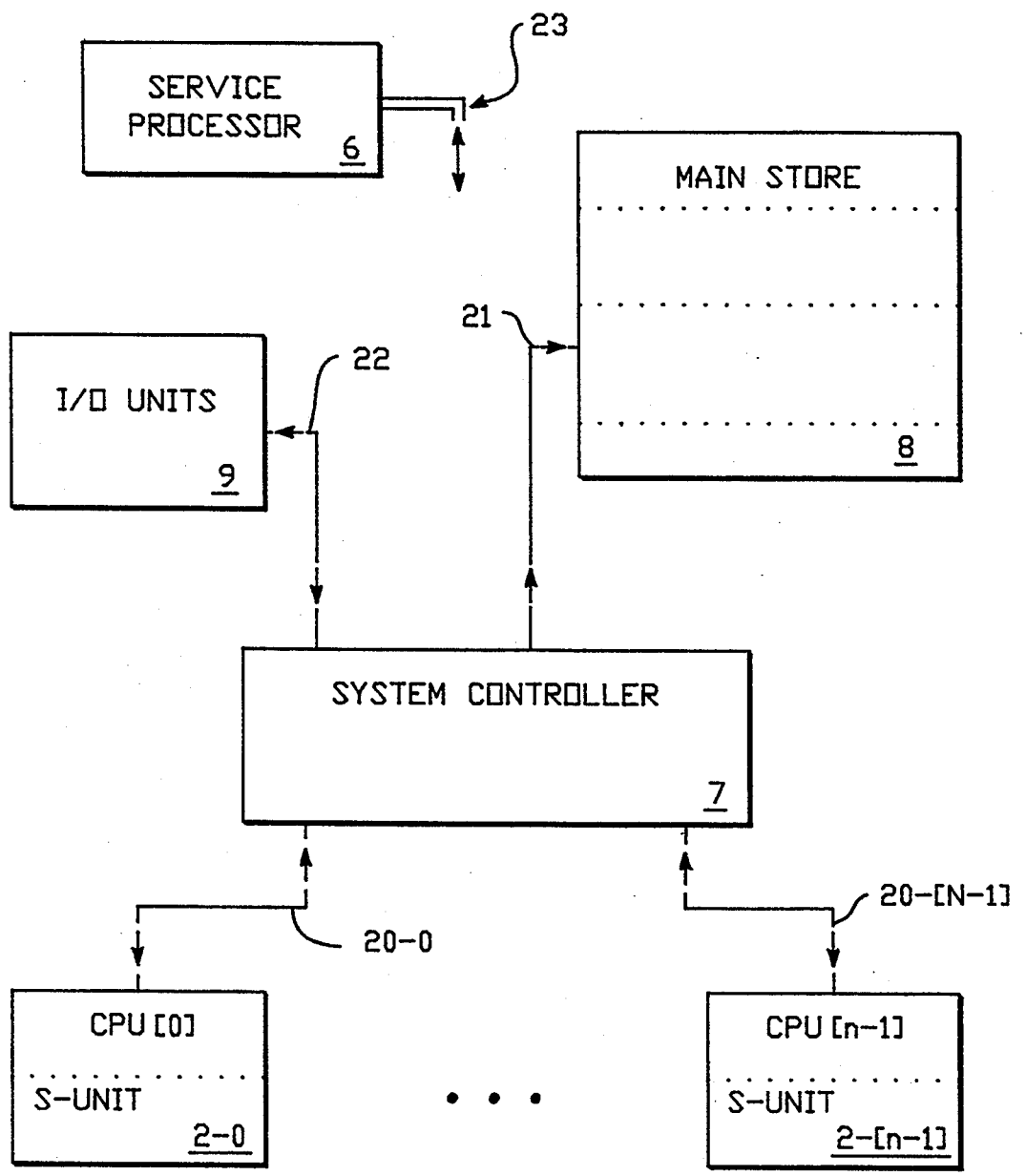
FIG. 1 depicts a block diagram of a multiple CPU system incorporating the present invention.
Figure 2:
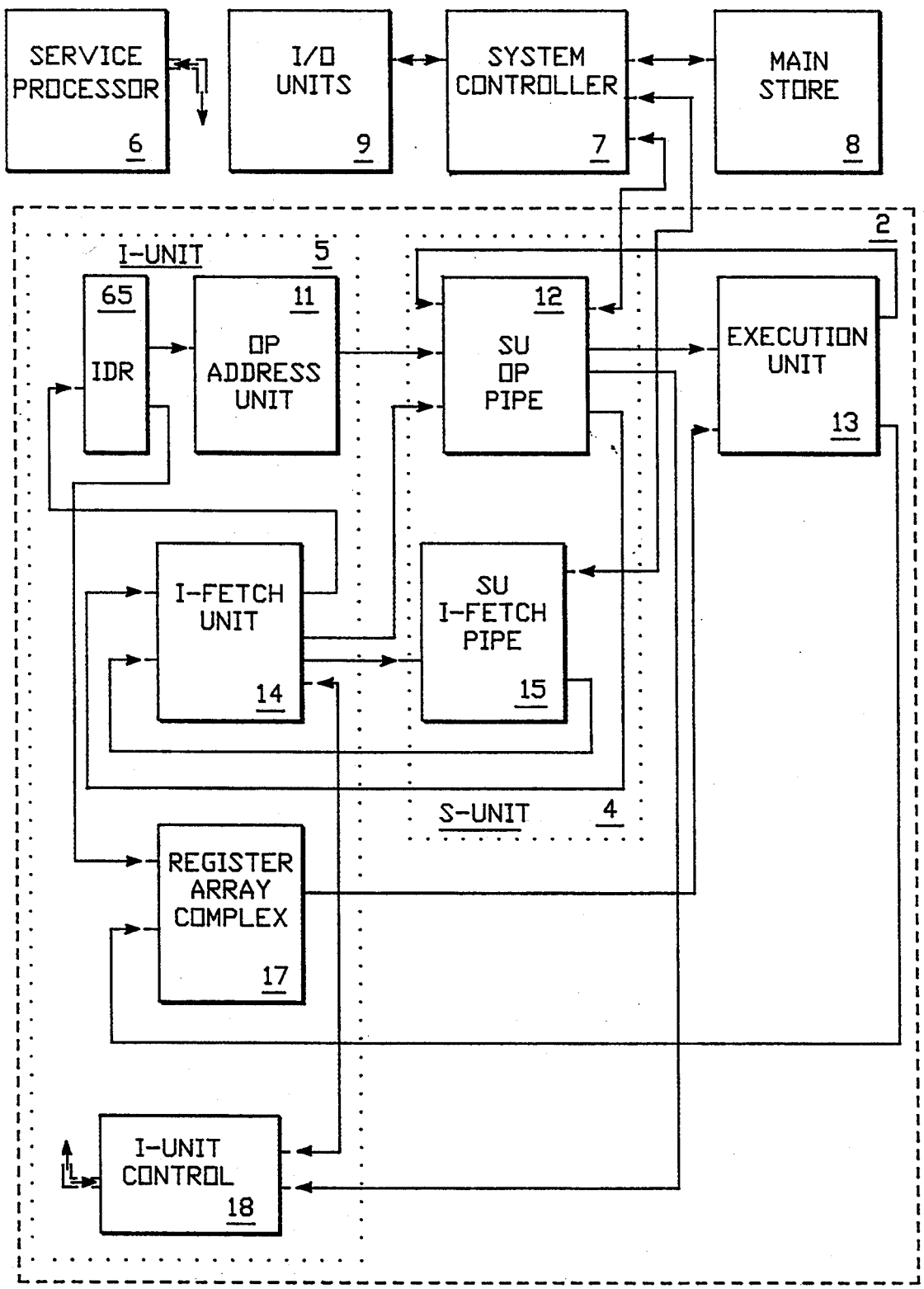
FIG. 2 depicts a block diagram of a CPU incorporating the present invention.

A detailed description of the preferred embodiments is presented with respect to the figures. FIGS. 1 and 2 provide a system overview of a computer system implementing the present invention. FIGS 3–5B provide a detailed functional description of the reconfiguration system according to the present invention.

Computer System Overview - FIGS. 1 and 2

FIG. 1 illustrates a multi-CPU computer system according to the present invention. The computer system includes a plurality of central processing units, each having a storage unit with a reconfigurable cache according to the present invention. Thus, CPUs (0) through CPU (n-1) are given reference numbers 2-0 through 2-(n-1). Each of the CPUs is coupled to system controller 7 across interfaces 20-0 through 20-(n-1). The system controller 7 also includes a mainstore interface 21. The system controller 7 control access to data among the CPUs and mainstore 8. Also coupled to the system controller 7 through interface 22 are the input/output units 9. A service processor 6 is coupled to all of the functional units of the computer system, as indicated by arrows 23 through a scan interface or otherwise as known in the art. The scan interface provides access to storage locations in the CPUs, and in the system controller through a path independent of the normal operational path of the CPUs or system controller 7 themselves. Thus, the service processor 6 is able to scan data indicating the state of the computer system out of the computer system without affecting the normal control path. Also, the service processor is able to write data into specific service data locations within the functional units of the system.

As indicated in the figure, each of the CPUs, CPU-0 through CPU-n-1 includes an individual storage unit. Each storage unit includes an operand cache and an instruction cache. The operand cache and instruction cache are reconfigurable according to the present invention as described in more detail below.

FIG. 2 provides a more detailed diagram of a CPU 2 according to the present invention. The CPU 2, as illustrated in FIG. 1, is coupled to the system controller 7, which is in turn coupled to the main store 8 and the I/O units 9. Service processor 6 is ,coupled to the CPU 2 with scan-in and scan-out facilities.

The CPU 2 includes an instruction unit 5 (I UNIT), a storage unit 4 (S UNIT), and an execution unit 13 (E UNIT). The I UNIT 5 includes an instruction decode register 65 (IDR) which supplies input to an operand address unit 11. Also, the IDR 65 supplies input to register array complex 17. The input to the IDR 65 is provided by an instruction fetch unit 14 (I FETCH UNIT). I UNIT control 18 controls the operation of the functional blocks of the I UNIT 5 and includes explicit connections to the I FETCH UNIT 14 and the S UNIT operand pipe 12.

The S UNIT 4 includes a storage unit operand pipe 12 and a storage unit I FETCH pipe 15. Coupled to the operand pipe 12 is an associatively addressed operand cache. Similarly, coupled to the I FETCH pipe 15 is an associatively addressed instruction cache. The S UNIT operand pipe 12 is addressed from the output of the operand address unit 11 and the I FETCH UNIT 14. The S UNIT I FETCH pipe 15 receives its addresses from the I FETCH UNIT 14.

The S UNIT operand pipe 12 supplies data to the E UNIT 13, the I UNIT control 18, and the I FETCH UNIT 14. The S UNIT I FETCH pipe 15 provides data to the I FETCH UNIT 14. Both the S UNIT I FETCH pipe 15 and the S UNIT operand pipe 12 are coupled to the system control units 7, through which access to the main store 8 is provided and data integrity operations are accomplished to insure cache consistency with other CPUs in the system.

The E UNIT 13 provides resulting data to the S UNIT operand pipe 12 and to the register array complex 17.

The overall computer system as described in FIGS. 1 and 2 operates in accordance with the IBM ESA/390 architecture and is further compatible with the Amdahl 5995-M computer.

Figure 3:
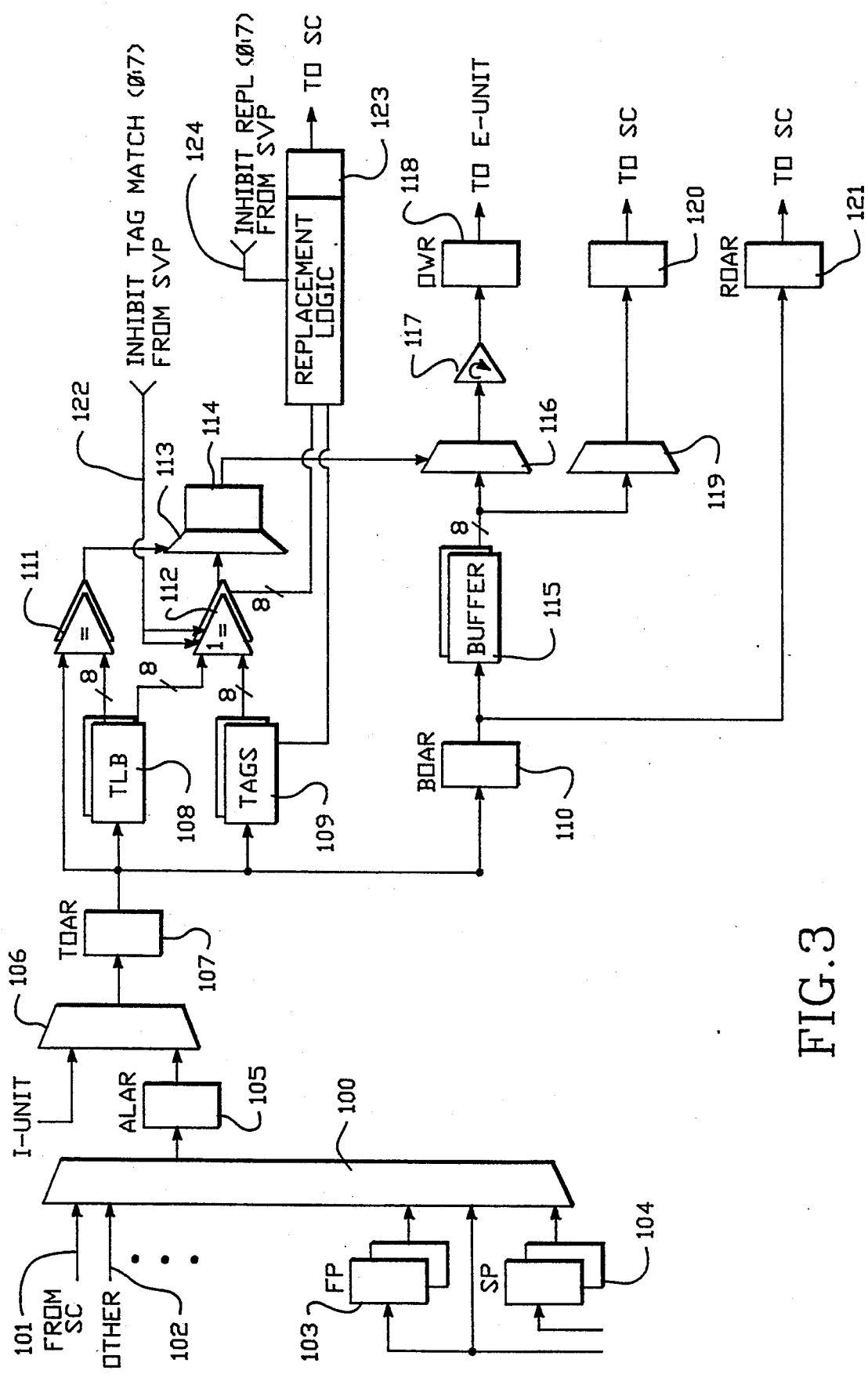
FIG. 3 is a schematic block diagram of the storage unit pipeline according to the present invention.
Figure 4:
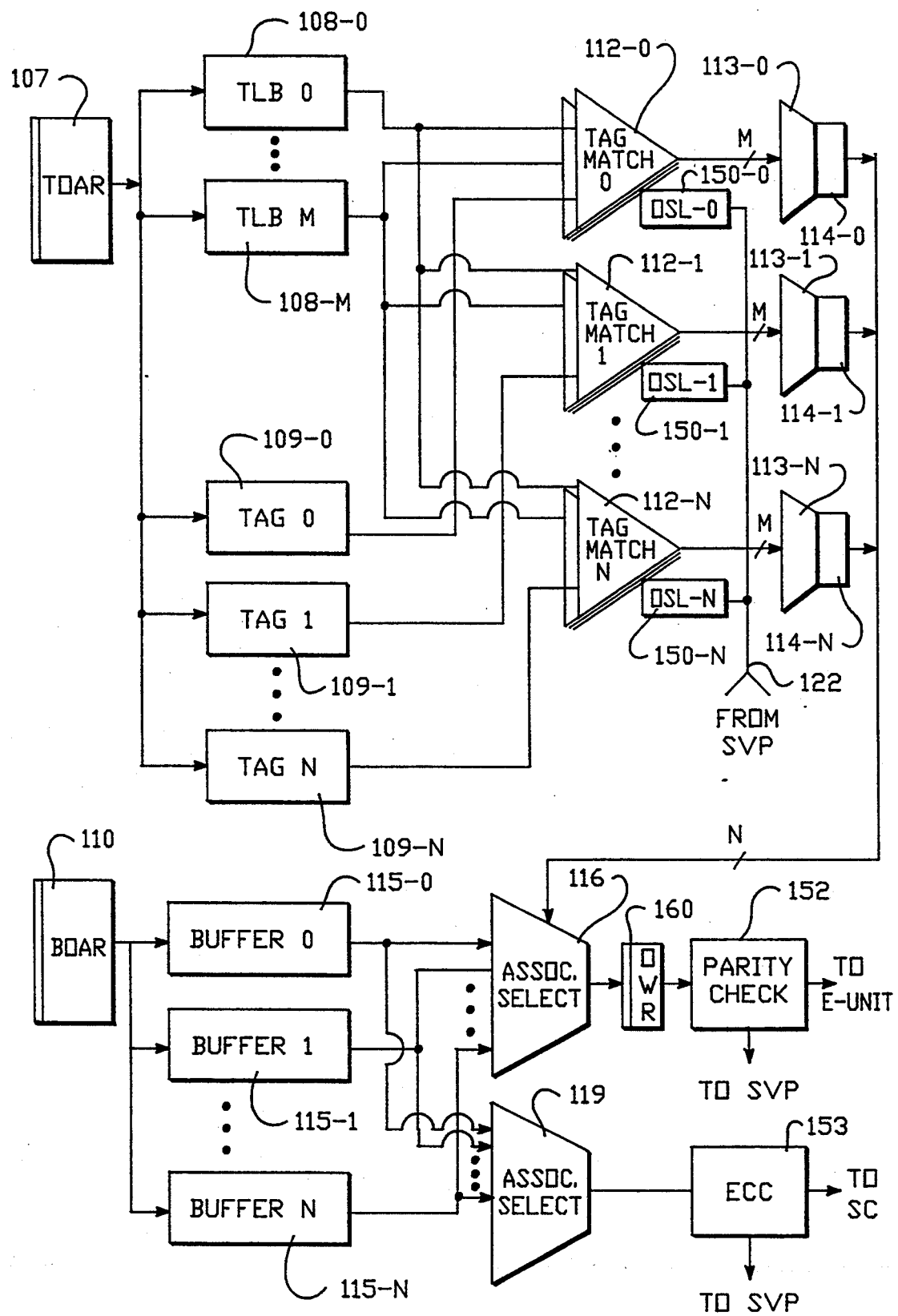
FIG. 4 is an expanded conceptual block diagram of a tag match logic with operating state latches, and the system controller interface according to the present invention.

S UNIT With Reconfigurable Caches (FIG. 3 and 4)

FIGS. 3 and 4 illustrate the reconfigurable cache in the storage unit according to the present invention. FIG. 3 is a simplified functional diagram of the S UNIT operand pipe. The system includes priority logic 100 receiving a plurality of requests for access to the cache. The inputs to the priority logic 100 include requests 101 from the system controller (SC) 7, and other requests 102 for processes needing access to data in the cache, such as fetch ports 103 and store ports 104. The output of the priority logic 100 is supplied to an address register 105. The address register 105 supplies its output to a second level of priority logic 106. The instruction unit has an access to the storage unit pipe through priority logic 106. The output of the priority logic 106 is supplied to the T cycle operand address register 107. The T cycle operand address register 107 is used to access the translation lookaside buffer 108 (TLB) and tag memory 109. Also, the output of the T cycle operand address register 107 is supplied to the B cycle operand address register 110.

The output of the TLB 108 is supplied to TLB match logic 111 in parallel with the output of the T cycle operand address register 107. Similarly, the output of the tag memory 109 is supplied to tag match logic 112 in parallel with a segment of the TLB memory 108. The output of the tag match logic is supplied to TLB associativity selector 113 which is further enabled by the TLB match logic 111. The results of the tag match are stored in register 114.

In parallel, the B cycle operand address register 110 is used to access the buffer memory 115. The; outputs, of the buffer memory 115 are supplied to associativity selector 116 which is enabled by the results of the tag match from register 114. The output of the selector 116 is supplied through alignment logic 117 to operand word register 118, and then to the execution unit.

Similarly, the output of the buffer 115 is supplied to associativity select logic 119 and on to a data move out register 120 which is coupled to the system controller.

The output of the B cycle operand address register 110 supplied to an R cycle operand address register 121 which is connected to the system controller.

In the system described in FIG. 3, the TLB 108, tags 109, and buffer 115 are divided into a plurality of segments or associativities. Thus, the TLB match logic 111 and tag match logic 112 includes a match logic segment for each associativity of the TLB and the tag.

The tag match logic 112 is coupled to the service processor across line 122. The service processor supplies an inhibit tag match signal across line 122 for inhibiting tag match on any of the associativities of the tag. In a preferred system, there are 8 associativities, so there are corresponding 8 inhibit tag match values.

Similarly, when a cache miss occurs, a move in request is supplied to the system controller. As part of the move in request, replacement logic 123 which receives outputs from the tag match logic 111 and from the tag memory 109 supplies a replacement address so that data in the replacement address can be swapped with the data to be moved in. Replacement addresses are supplied from an output register in the replacement logic 123 to the system controller. The replacement logic is also coupled to the service processor across lines 124. The service processor generates a command inhibit replacement (0:7) for each of the associativities.

Thus, in order to take an associativity of the buffer 115 offline, the service processor issues an inhibit tag match signal and an inhibit replacement signal for the selected associativity. This has the effect of disabling accesses to the buffer 115 by the I UNIT for delivery of operands to the execution unit. However, accesses by the system controller, for delivery of data to the system controller, are not affected.

FIG. 4 provides an expanded view of the tag and buffer access paths for the S UNIT pipe of FIG. 3. As can be seen, the T cycle operand address register 107 accesses a plurality of segments of the TLB and tag memories. Thus, the output of the T cycle operand address register 107 is supplied as an input to the TLB segment 108-0 through TLB segment 108-M. Similarly, the output of the T cycle operand address register 107 is used to access the tag segment 109-0, tag segment 109-1 through tag segment 109-N. The outputs of the tag segments 109-0 through 109-N are supplied as inputs to respective tag match segments 112-0 through tag match segment 112-N. Coupled with each of the tag match segments 112-0 through 112-N is an operating state latch OSL-0 150-0, through OSL-N 150-N. The operating state latches 150-0 through 150-n are all written by the service processor across line 122. The outputs of the tag match segments 112-0 through 112-N are supplied via TLB associativity selectors 113-0 through 113-N and tag match latches 114-0 through 114-N to the associativity select logic 116 for enabling selection of the respective segment of the buffer for which a tag match was detected.

The B cycle operand address register 110 is used to access the plurality of segments of the buffer 115-0 through 115-n in parallel as described above.

Thus, the inputs to the; associativity select logic 116 include data from the plurality of segments of the buffer 115-0 through 115-N. The output of the associativity select logic 116 is supplied to the operand word register 160 and then on to error checking logic 152 and then on to the E unit. If errors are detected, the service processor is notified, where the errors are analyzed to determine whether the error indicates a bad segment of the buffer exists which needs to be configured out of operation.

In parallel with the associativity select logic 116 is a second associativity select logic 119 for selecting data for supply to the system controller. Thus, the inputs to associativity select logic 119 include the outputs of the buffer segments 115-0 through 1 15-n. The output is supplied to error checking and correcting logic 153 and then to the system controller. Errors detected by error checking and correcting logic 153 are reported to the service processor and the system controller.

Thus, in operation, when the service processor receives indications of errors in the cache buffers 115-0 through 115-N which indicates that one of the segments 0 through N is suffering hard errors and should be reconfigured out of operation, it issues an inhibit tag match signal on line 122. The inhibit tag match signal loads one of the operating state latches OSL-0 through OSL-N in order to inhibit tag match on the offline associativity. In this manner, the associativity selector 116 is inhibited from selecting the offline associativity. Furthermore, any attempt to access the offline associativity will result in a cache miss, and a move in request issued by the storage unit to the system controller through the R cycle operand address register 121 (see FIG. 3).

Also, as described above with respect to FIG. 3, the replacement logic 123 is inhibited from selecting a line in the out of service associativity for replacement with the requested move in.

System Controller (FIG. 5)

Figure 5A:
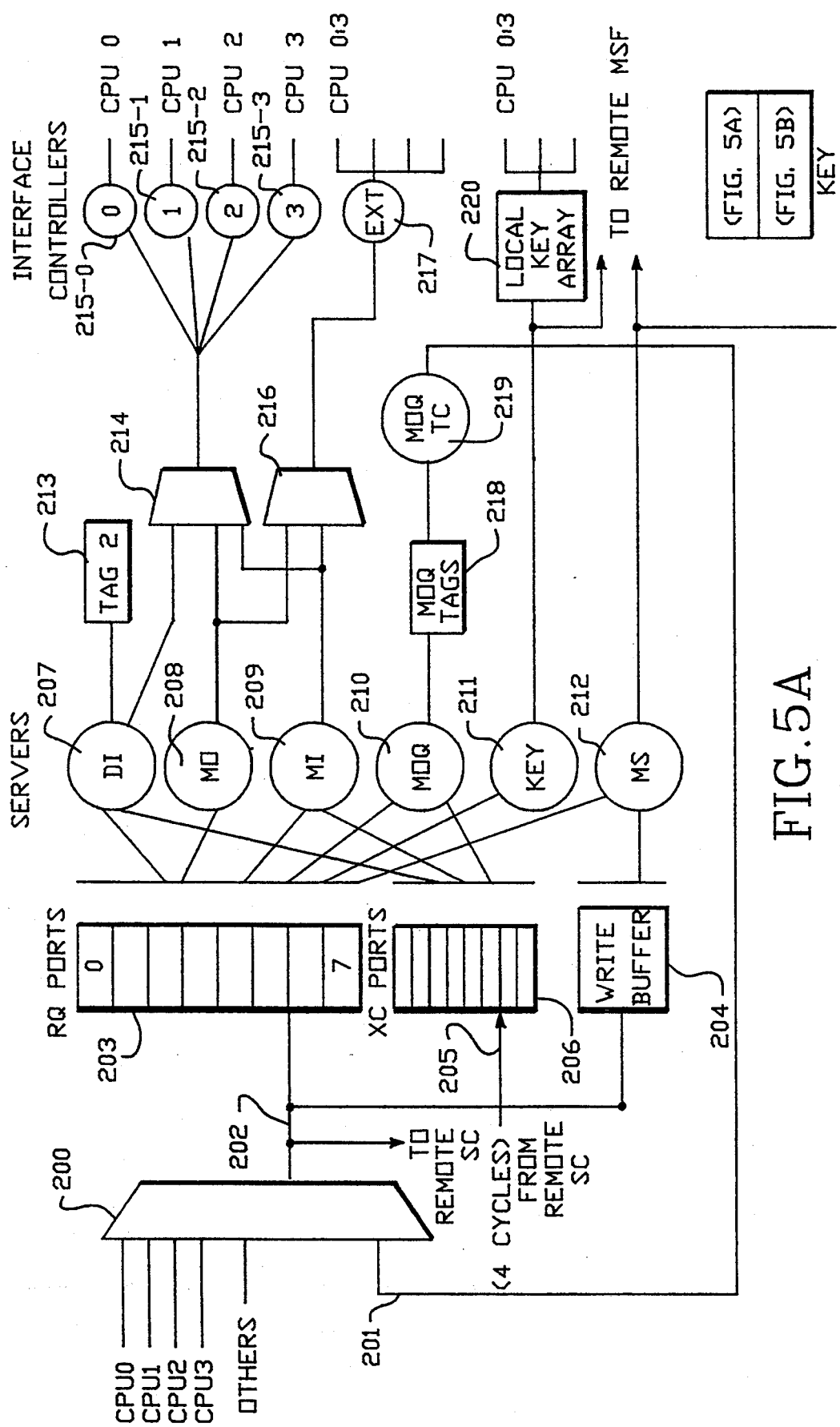
FIGS 5A and 5B is a functional block diagram of the system controller for a multi-CPU system according to the present invention.
Figure 5B:
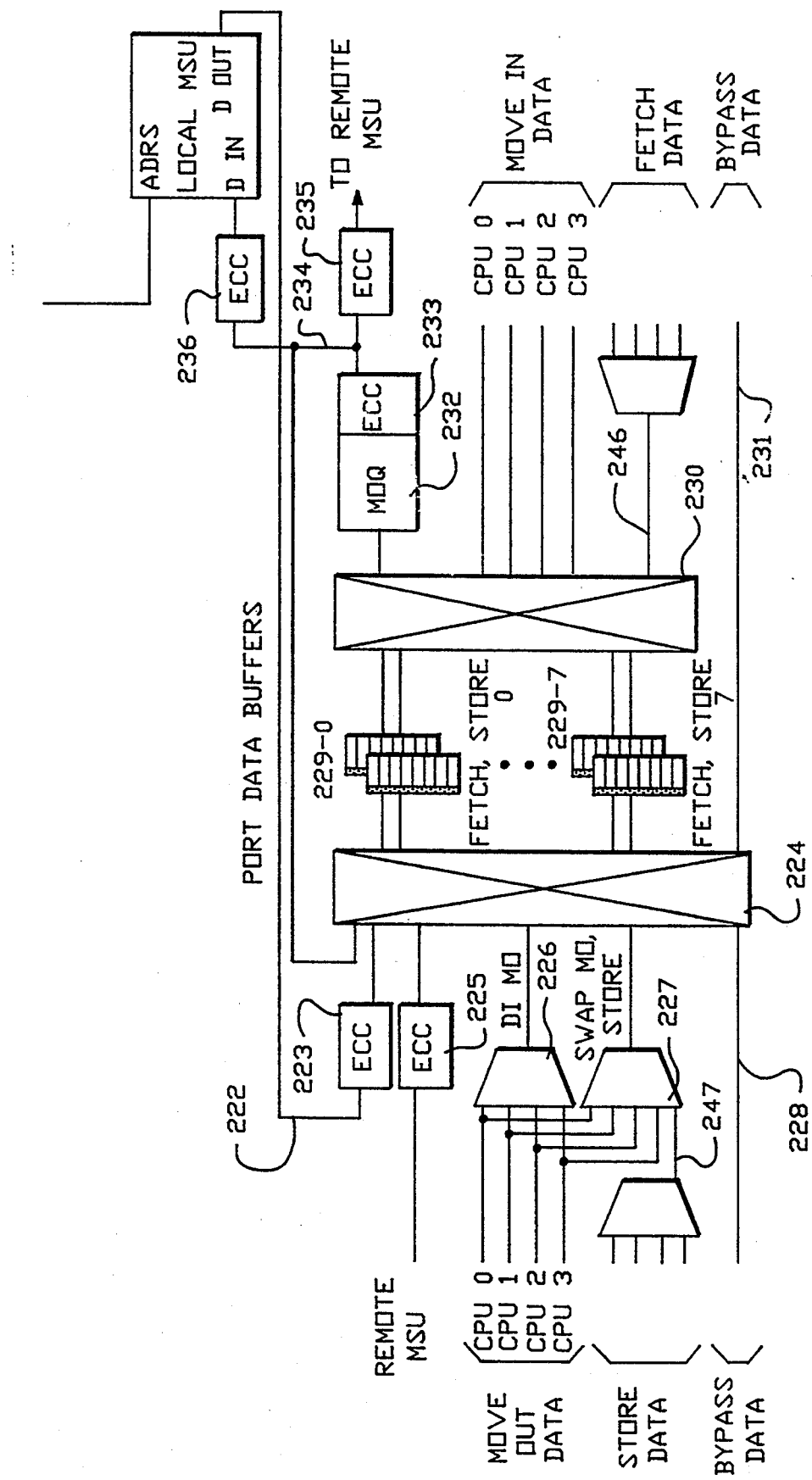

FIGS. 5A and 5B illustrate a functional diagram of the system controller according to the present invention. The system controller includes a system for controlling access to data among the CPUs in other portions of the system, such as the service processor, the main storage unit, I/O processors, and the like. Thus, it includes an input priority logic 200 which receives requests from CPU 0 through CPU n (n=3 in the embodiment of FIG. 5A and 5B). Other requestors to the system controller are also supplied as inputs to the priority logic 200, such as the service processor, I/O processors, and the like. Also, a move out queue bus 201 is supplied as an input to the priority logic 200. The output of the priority logic 200 is supplied on line 202 to the request (RQ) ports 203 and to a write buffer 204. A remote system controller (in a system including a plurality of system controllers) is also coupled through line 205 to extended request ports 206.

The request (XC) ports 203 and 206 are coupled to a plurality of servers, including a data integrity (DI) server 207, a move (MO) out server 208, a move in (MI) server 209, a move out queue (MOQ) server 210, a key server 211, and a main store (MS) server 212. The remote system controller has access only to the data integrity server 207, move in server 209, and move out queue server 210. The write buffer 204 has access only to the main store server 212 and is dedicated for writes to main store.

The data integrity server 207 is coupled to the TAG 2 logic 213. The TAG 2 logic includes copies of the tags from all of the storage units for the CPUs of the system. Thus, data integrity and cache consistency operations are carried out using the data integrity server 207 and the TAG 2 logic 213. Requests for data from the data integrity server 207, move out server 208, and move in server 209, arc; supplied through selector 214 to the interface controllers for each of the CPUs 215-0 through 215-3. Also, requests from move out server 208 and move in server 209 are supplied through selector 216 through an extended interface controller (ext) 217 to the CPUs and other requestors in the system, such as service processors, I/O processors, and the like.

The move out queue server 210 is coupled to the move out queue tags (MOQ Tags) 218 and the move out queue controller (MOQ TC) 219. The output of the move out queue controller 219 is supplied on line 201 to the select logic 200.

The key server 211 drives local key array 220 and is also coupled to a remote key array. The local key array 220 is used to provide storage keys to the CPUs and other requestors in the system.

The main store server 212 supplies addresses to the local main store unit 221, and to a remote main store facility if present in the system.

The data paths for the system controller are shown in the bottom half of the figure. The output of the local main store unit is supplied on line 222 to ECC logic 223. The output of the ECC logic 223 is supplied to a switch 224. Other inputs to the switch 224 include the output of ECC logic 225 which is supplied from the remote main store unit (MSF), the output of the selector 226 which is used to supply data integrity move out (DI MO) data from the CPUs, and output of the selector 227 which is used to supply swap move out data from the CPUs in the system and store data path 247 from the various units in the system. Finally, the switch 224 receives bypass data across line 228. The output of the switch 224 is supplied to the fetch and store buffers 229-0 through 229-7.

The data in the fetch and store buffers is supplied to switch 230. The switch 224 also supplies bypass path 231.

The output of the switch 230 supplies move out queue (MOQ) buffers 232, the move in data paths 246 to the respective CPUs, and the fetch data paths to the variety of fetch data requestors. The output of the move out queue is supplied via ECC logic 233 on line 234 through error checking correcting logic 235 to the remote main store unit, and through ECC logic 236 to the local main store unit (MSO). Also, the data on line 234 is supplied as an input to the switch 224.

The system controller has access to the buffers in the storage units of the respective CPUs independent of the tag match logic in the respective storage units because of the use of the TAG 2 logic 213. Thus, whenever a request for data in a portion of a buffer which has been configured offline is made, a move in request is issued by the CPU to the system controller. The data integrity server 207 determines whether the line is present in a private state in any of the CPUs in the system. If it is in a private state in a buffer associativity that has been configured offline, the system controller still has access for data integrity move out of the data. If the data is held in a public state in a portion of a buffer which has been configured offline, no data integrity move out is needed. Control may provide for determining whether the requested private line had been modified. If it had not, then the data integrity move out could be avoided.

Thus, when a move in request is made for a private line in a section of the cache which has been configured offline, the data integrity server responds to the move in request. A move out request is made to retrieve the line if held in a private state from the offline segment of the cache. When the private copy is moved out, error checking correcting logic will detect any error in the line. If it is correctable, the move out will be successful to the requesting CPU and a copy made to main store. If the error is uncorrectable, then appropriate recovery activity can commence.

Conclusion

According to the present invention, the I FETCH and operand cache RAMs can be reconfigured by taking associativities offline. These associativities may be taken offline at any time without invoking a quiescent state or an extended clocks of period.

Reconfiguration is carried out by setting operating state latches through the service processor as follows:
(1) Inhibit tag match on the offline associativity;
(2) Inhibit error history logging on the offline associativity;
(3) Force the offline associativity to indicate data is known bad for error checking logic;
(4) Inhibit the offline associativity from being chosen for replacement; and
(5) Inhibit parity checks in the tags in the offline associativity.

In the case of the operand tag, there is a possibility that data in the offline associativity may have been a modified private line. In this case, the data integrity server is relied upon to detect the modified data. Any single bit hard errors in the data will be corrected by hardware during the data integrity move outs, and any multiple bit errors will result in the data being marked in error in the main store.

Thus, the present invention circumvents some of the difficulties of prior methods by taking a failing portion of the cache offline for the purposes of access by the CPU and for replacement with new data, but leaving it online for the purposes of cache consistency operations.

The invention is particularly suited to implementation in cache memories in computer systems such as that described above. However, it may be applicable to any reconfigurable memory system having two access paths, one of which is intolerant to errors in the cache, and the other which is more tolerant in terms of system performance.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A cache memory system, comprising:
   a buffer memory having a plurality of segments storing lines of data in addressable storage locations;
   a first access path for access to the plurality of the buffer memory in parallel;
   a second access path for access to the plurality of segments of the buffer memory in parallel;
   a tag memory having a corresponding plurality of segments storing tags identifying lines of data in the buffer memory and tag match logic, coupled with the first access path, for matching tags in the tag memory corresponding to lines of data in the plurality of segments with requests for the line of data in the first access path; and
   means, coupled to the first access path, for selectively disabling access to segments of the buffer memory through the first access path where the means for selectively disabling includes means for selectively inhibiting the tag match logic for individual segments in the plurality of segments of the buffer memory.

2. The cache memory system of claim 1, wherein the means for selectively disabling includes:
   a plurality of operating state latches coupled with the tag match logic and respective segments of the tag memory, the operating state latches having a first state enabling tag match and a second state disabling tag match for the respective segments.

3. The cache memory system of claim 1, wherein the first access path provides an interface to a data processing unit, and the second access path provides an interface to a main storage unit.

4. The cache memory system of claim 1, wherein the first access path provides art interface to a data processing unit, and the second access path provides an interface to cache consistency logic.

5. For a computer system including a plurality of processors sharing access to a main storage system with a system controller controlling the shared access and including a service processor coupled with the plurality of processors, a cache memory system coupled with a local processor of the plurality of processors comprising:
   a buffer memory having a plurality of segments storing lines of data;
   a first access path, having an interface to the local processor, for access to the plurality of segments of the buffer memory in parallel including segment match logic for enabling access to a segment requested by the local processor;
   means, coupled to the first access path and having an interface to the service processor, for selectively disabling access to segments of the buffer memory through the first access path in response to commands from the service processor; and
   a second access path, having an interface to the system controller, for access to the plurality of segments of the buffer memory in parallel, including segment selection logic for enabling access to a segment requested by the system controller.

6. The cache memory system of claim 5, wherein the segment match logic includes:
   a tag memory storing tags identifying lines of data in the buffer memory; and
   tag match logic, coupled to the first access path and the tag memory, for matching tags in the tag memory corresponding to lines of data in the plurality of segments with requests for the line of data from the first access path; and
   wherein the means for selectively disabling includes means for selectively inhibiting the tag match logic for individual segments in the plurality of segments of the buffer memory.

7. The cache memory system of claim 6, wherein the means for selectively disabling includes:
   a plurality of operating state latches coupled with the tag match logic and respective segments of the tag memory, the operating state latches having a first state enabling tag match and a second state disabling tag match for the respective segments.

8. The cache memory system of claim 5, further including cache line replacement logic coupled to the plurality of segments of the buffer memory and to the system controller to replace old lines of data with new lines of data in the buffer memory; and
   the means for selectively disabling includes means for selectively inhibiting the cache line replacement logic for individual segments in the plurality of segments of the buffer memory.

9. The cache memory system of claim 8, wherein the means for selectively disabling further includes:
   a plurality of operating state latches coupled with the cache line replacement logic and respective segments of the tag memory, the operating state latches having a first state enabling cache line replacement and a second state disabling cache line replacement for the respective segments.

10. The cache memory system of claim 5, further including:
    error detection logic coupled to the first access path and having an interface to the service processor for signalling the service processor upon the detection of errors in lines of data in the buffer memory, and wherein the service processor issues commands to disable selected segments when analysis of the errors indicates hard defects in the selected segment.

11. The cache memory system of claim 5, further including:
    error detection and correction logic coupled to the second access path and the system controller for signalling the system controller upon detection of uncorrectable errors in lines of data in the buffer memory.

12. For a computer system including a plurality of processors sharing access to a main storage system with a system controller controlling the shared access and including a service processor coupled with the plurality of processors, a cache memory system coupled with a local processor of the plurality of processors comprising:

an associative buffer memory having a plurality of associativities and a plurality of physical memory segments storing lines of data of respective associativities;

a tag memory storing tags identifying lines of data in the buffer memory;

a first access path, having an interface to the local processor, for access to the plurality of physical segments of the buffer memory in parallel including tag match logic, coupled to the tag memory, for matching tags in the tag memory corresponding to lines of data in the plurality of associativities with requests for the line of data from the first access path, and associativity selection logic for enabling access by the local processor to a physical segment storing lines of data of the associativity indicated by the tag match logic;

error detection logic coupled to the first access path and having an interface to the service processor for signalling the service processor upon the detection of errors in lines of data in the buffer memory;

means, coupled to the first access path and having an interface to the service processor, for selectively disabling the tag match logic for selected associativities of the buffer memory through the first access path in response to commands from the service processor, wherein the service processor issues the commands when analysis of the errors indicates hard defects in a physical segment storing lines of data of the selected associativity;

a second access path, having an interface to the system controller, for access to the plurality of segments of the buffer memory in parallel, including associativity selection logic for enabling access to a physical segment storing the respective associativity requested by the system controller; and error detection and correction logic coupled to the second access path and the system controller for signalling the system controller upon detection of uncorrectable errors in lines of data in the buffer memory.

13. The cache memory system of claim 12, wherein the means for selectively disabling includes:

a plurality of operating state latches coupled with the tag match logic and respective segments of the tag memory, the operating state latches having a first state enabling tag match and a second state disabling tag match for the respective segments.

14. The cache memory system of claim 12, further including cache line replacement logic coupled to the plurality of associativities of the buffer memory and to the system controller to replace old lines of data with new lines of data in the buffer memory; and the means for selectively disabling includes means for selectively inhibiting the cache line replacement logic for individual associativities in the plurality of associativities of the buffer memory.

15. The cache memory system of claim 14, wherein the means for selectively disabling further includes:

a plurality of operating state latches coupled with the cache line replacement logic and respective segments of the tag memory, the operating state latches having a first state enabling cache line replacement and a second state disabling cache line replacement for the individual associativities.

* * * * *

UNITED STATES PATENT AND TRADEMARK OFFICE
CERTIFICATE OF CORRECTION

PATENT NO. : 5,410,668
DATED : April 25, 1995
INVENTOR(S) : Ronald N. Hilton It is certified that error appears in the above-identified patent and that said Letters Patent is hereby corrected as shown below:

Column 9, line 57, "art" should be --an--.

Signed and Sealed this

Sixteenth Day of April, 1996

BRUCE LEHMAN

Attest:

Attesting Officer

Commissioner of Patents and Trademarks